(12) United States Patent
Shino

(10) Patent No.: US 6,430,111 B1
(45) Date of Patent: Aug. 6, 2002

(54) ELECTRONIC TIMEPIECE

(75) Inventor: Naotoshi Shino, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/541,242

(22) Filed: Apr. 3, 2000

(51) Int. Cl.[7] .......................... G04B 1/00; G04B 37/00; G04C 3/00
(52) U.S. Cl. ........................ 368/204; 368/276; 368/286
(58) Field of Search .......................... 368/88, 276, 280, 368/281, 294–296, 299, 309, 203–204

(56) References Cited

U.S. PATENT DOCUMENTS

| | | | |
|---|---|---|---|
| 4,106,279 A | * | 8/1978 | Martin et al. |
| 4,282,597 A | * | 8/1981 | Yenawine et al. ........... 368/280 |
| 5,280,646 A | | 1/1994 | Koyama et al. ............. 455/300 |

FOREIGN PATENT DOCUMENTS

| | | |
|---|---|---|
| CH | 0608328 | 1/1979 |
| EP | 0846989 | 6/1998 |
| JP | 60078550 | 5/1985 |

* cited by examiner

Primary Examiner—Vit Miska
(74) Attorney, Agent, or Firm—Adams & Wilks

(57) ABSTRACT

To discharge the static electricity intruded through a timepiece exterior case without giving an adverse effect upon an electronic circuit of the timepiece.

In a timepiece having a structure that a case is insulated in plurality of number using as insulating means a heat insulation material of a heat generation timepiece exterior case and a timepiece exterior case is used as electrode for charging and a timepiece having a structure that similarly a timepiece upper case and lower case are electrically insulated, a circuit pattern for allowing the static; electricity intruded through a timepiece exterior to freely discharge into air is provided in a wiring board in the heat generator. This made possible to prevent malfunction of a timepiece electronic circuit due to static electricity.

40 Claims, 5 Drawing Sheets

ELECTRONIC TIMEPIECE

BACKGROUND OF THE INVENTION

The present invention relates to an electronic timepiece having in the timepiece a secondary battery to be charged from outside the timepiece, and which has an electrostatic protection function for a charge terminal.

In recent years, electronic timepieces have been produced that have generator means such as solar generation means or thermoelectric generation means not requiring battery exchange. These timepieces have structurally provided therein a secondary battery so that generated power is stored in the secondary battery so that the timepiece need to be stopped even when power generation cannot be made. Here, if the secondary battery is small in capacity, there often occur cases in which storage electric power is used up. In order to prevent this, there is a tendency of using secondary batteries, large in capacity. However, where storage electric cower is used up it is difficult to charge the secondary battery up to a level necessary to operate the timepiece. There may be a case where the timepiece is rendered inoperable as the case may be. Due to this, a structure is used to directly charge the secondary battery from the outside thereby preventing such a disadvantage. Also, a timepiece has been put into products structured to charge the secondary battery inside the timepiece directly from the outside without having generator means.

In such a timepiece, because a charging electrode is extended to the outside, there is a possibility of applying an electric shock due to static electricity. A static electricity protection circuit is used to prevent a disadvantage due to electric shock.

The detailed circuit of a conventional static electricity protection circuit is explained using FIG. 1. Also, FIG. 2 shows a block diagram of an electronic timepiece having the conventional static electricity protection circuit. An input terminal 301 is connected to a first external electrode 101 through first connection means 114 of FIG. 2. The input terminal 301 is connected to a resistance 302. The resistance 302 has the other end connected to an output terminal 305, an anode of a third diode 303 and a cathode of a fourth diode 304. The third diode 303 has a cathode that is connected to a positive potential 112 on a positive side of storage means 109. The fourth diode 304 has an anode connected to a reference potential 111 of a negative side of the storage means 109. This reference potential 111 is extended outside the timepiece through the second external electrode 107. The output terminal 305 is connected to an input part of a charge protection circuit 108 through the first diode 103 for reverse flow prevention. On the other hand, the voltage generated by a heat generator 104 is supplied to a booster circuit 105 through second connection means 113. The electric power increased in voltage by the booster circuit 105 is supplied to the input part of the charge protection circuit 108 through the second diode 106. The charge protection circuit 108 has an output connected with the storage means 109 to control the charge to the storage means 109, preventing overcharge of the like. The electric power stored on the storage means 109 is supplied to a timepiece circuit 110, and the timepiece circuit counts and displays a time.

If static electricity enters the input terminal 301, it is reduced in voltage by the resistance 302 and further flows to the third diode 303 or fourth diode 304 thereby reducing over-voltage in a spike form. The effect of static electricity likely to occur at the output circuit 305 or the subsequent is reduced thus preventing breakdown or malfunction.

As charge electrodes an upper case and lower case of an exterior case are used. In this case, because insulation is provided between the upper case and the lower case, there is a case that the static electricity externally entered through the case flows to an electronic circuit inside the electronic timepiece without being immediately discharged to a human body. In order to reduce the effect of the static electricity on the timepiece circuit, the above static electricity protection circuit is used.

However, in the conventional static electricity protection circuit the effect is not sufficient in reducing the effort of static electricity. Although electrostatic breakdown can be prevented, circuit malfunction could not be prevented up to 6 KV of contact discharge in static electricity rating IEC1000-4-2 and 8 KV of in-air discharge.

In routine use, discharge occurs up to approximately 8 KV of contact discharge and 15 KV of in-air discharge as the operation may be. Accordingly, in this case, the conventional static electricity protection circuit could not have prevented malfunction of the timepiece circuit.

SUMMARY OF THE INVENTION

It is an object of the present invention to prevent malfunction, breakage or deterioration of an electronic timepiece due to high voltage of about 8 KV of contact discharge or 15 KV of in-air discharge in order not to cause trouble in routine use.

The electronic timepiece of the present invention is characterized in that, in an electronic timepiece having an exterior case structured by storage means, a conductor case and an insulation case, the conductor case is in a structure divided by the insulator case into a plurality wherein each conductor case is electrically in an insulation state. Furthermore, the conductor case is partly, structurally used as an electrode to charge to the storage means thereby enabling external energy of the electronic timepiece to the storage means. In these structures, in order to increase electrostatic withstand voltage, a pattern for discharging static electricity is further provided on a wiring board in a heat generator besides the usual static electricity protection circuit. Also, an air discharge layer is further provided between charge electrodes. This can prevent malfunction, breakage and deterioration of the timepiece circuit.

A circuit diagram of a conventional static electricity protection circuit.

FIG. 2

A circuit block diagram of a conventional electronic timepiece with static electricity protection circuit.

FIG. 3

A circuit block diagram of an electronic timepiece with static electricity protection circuit of the present invention.

FIG. 4

A sectional view of a electronic timepiece with static electricity protection circuit of the present invention.

FIG. 5

A detailed diagram of a static electricity discharge pattern.

FIG. 6

A detailed sectional structural view of a static electricity discharge layer.

DETAILED DESCRIPTION OF THE PREFERRED EMBODIMENTS

Figure 1:
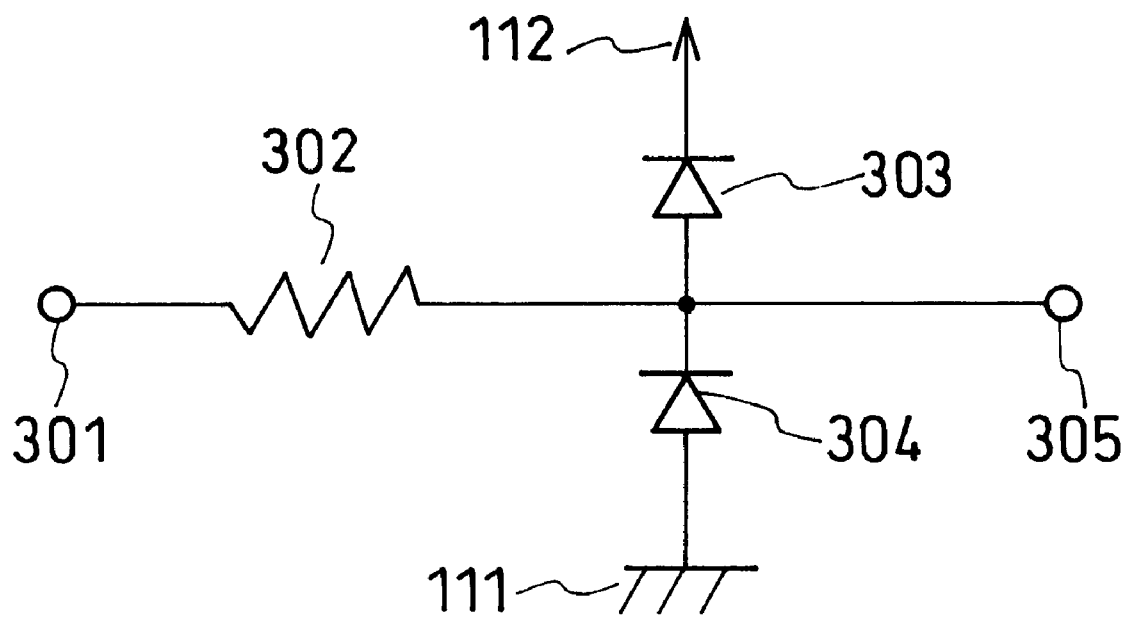
FIG. 1
Figure 2:
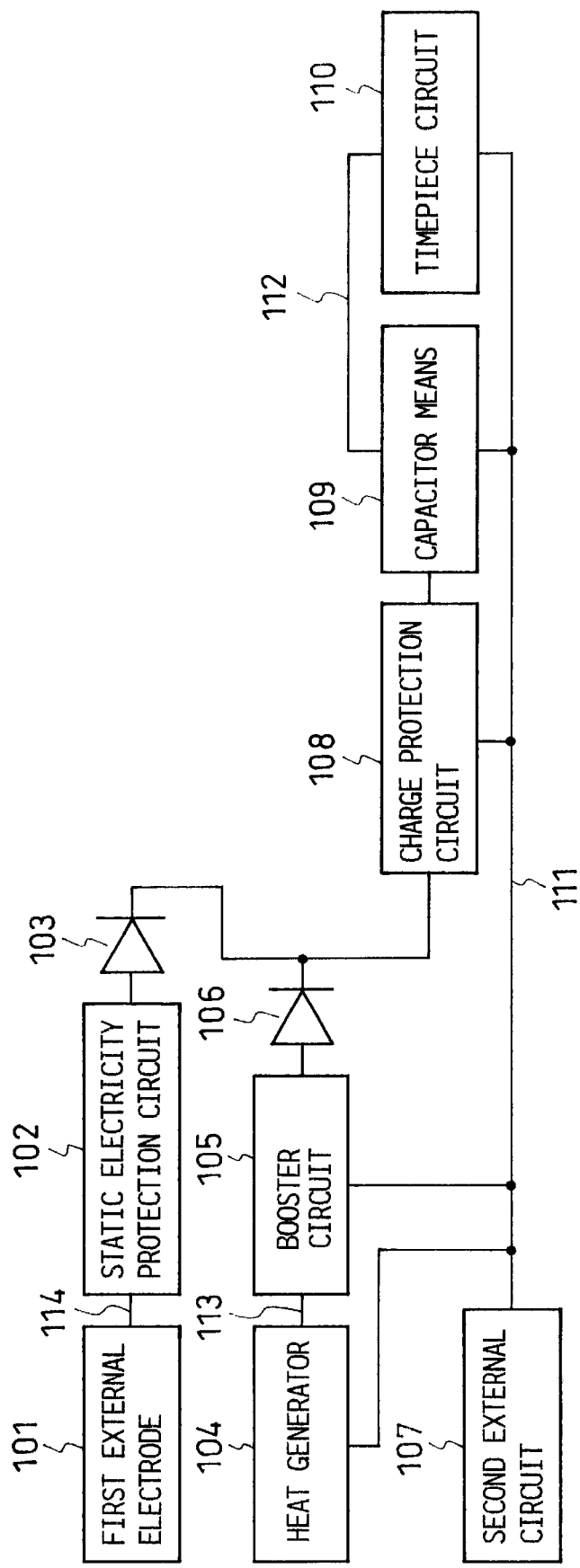
Figure 3:
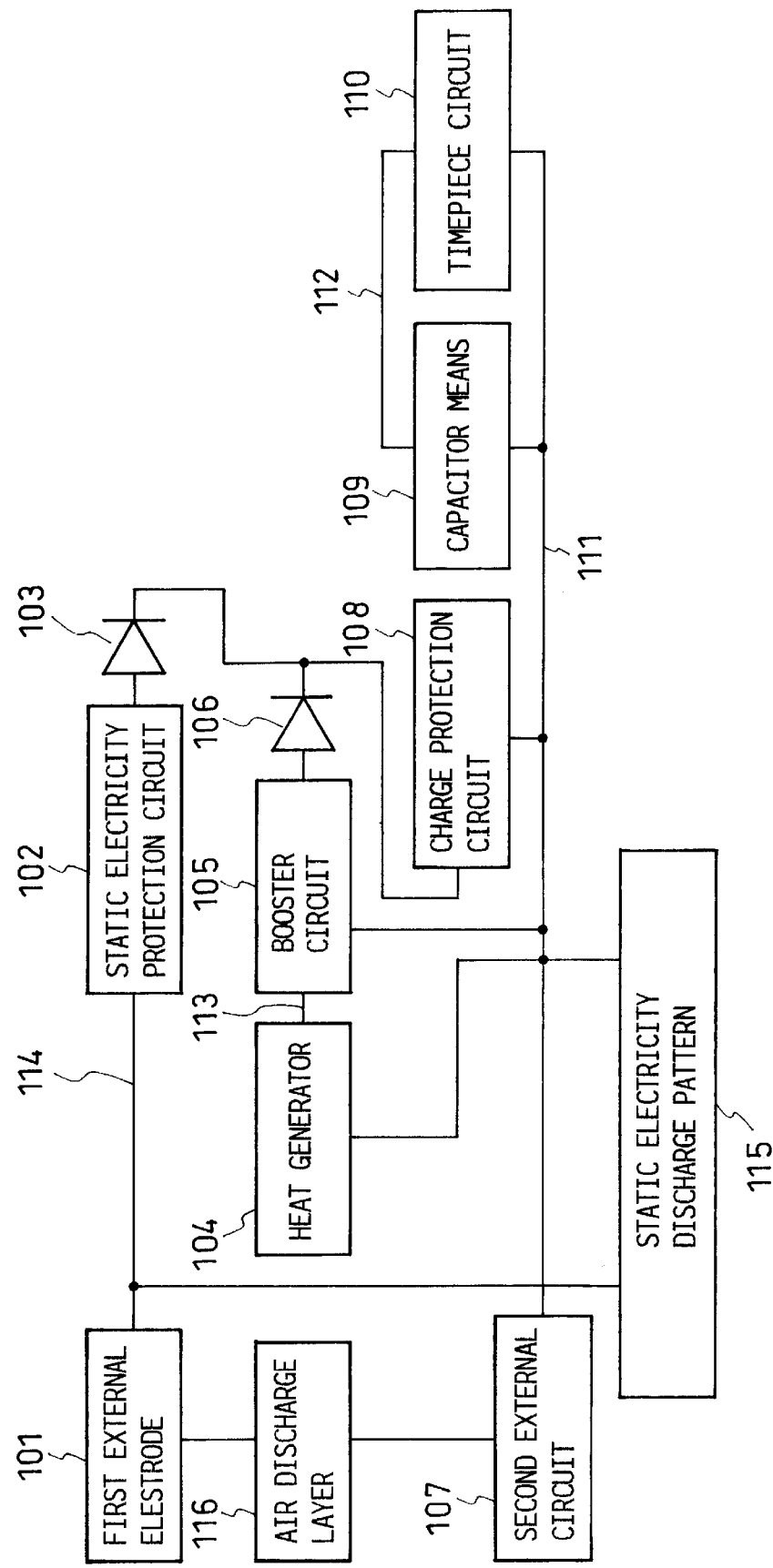

FIG. 3 is a block diagram showing an embodiment of the present invention, illustrating an example of an electronic timepiece with discharge function. Those elements similar to FIG. 2 are identified with the same reference numerals, and an explanation thereof is omitted. In FIG. 3, an electrostatic discharge pattern 115 is incorporated in a heat generator 104, and is structured to connect to a first external electrode 101 and second external electrode 107 as direct as possible by use of upper and lower electrodes of the heat generator, 104. Also, an air discharge layer 116 is provided between the first external electrode 101 and the second external electrode 107. Both the electrostatic discharge pattern 115 and the air discharge layer 116 allows currents flow through a route as short as possible so as not to draw electric energy into a timepiece circuit, promptly discharging it to air. Accordingly, efficient prevention is made against intrusion of electric noise into the timepiece circuit and the occurrence of defects.

Figure 4:
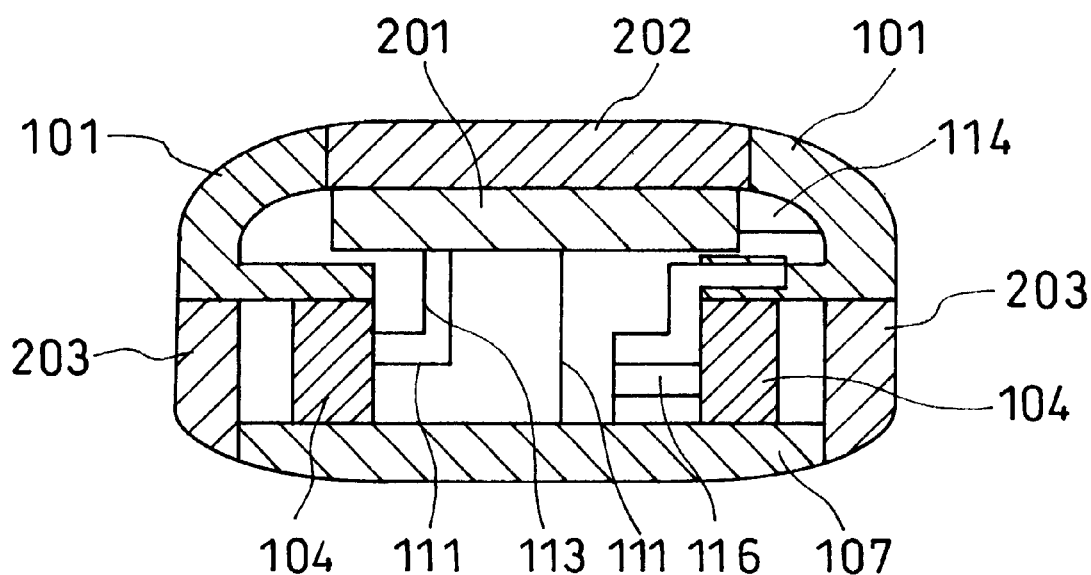

FIG. 4 is a sectional view showing a structure of a heat generating electronic timepiece as an embodiment of the present invention. A movement 201 is a timepiece movement including an electronic timepiece electronic circuit, a motor, a wheel train and a display device. The heat generator 104 has a multiplicity of P-type thermoelectric materials and N-type materials between upper and lower substrates so that they are electrically connected alternately in series. A voltage is obtainable almost in proportion to a temperature difference between the upper and lower ones. A glass 202 is a glass of the timepiece. A heat insulation case body 203 is an insulation member to insulate between a heat radiating side and a heat absorbing side so that the heat generator 104 can efficiently generate power. The insulation member 203 thermally insulates and electrically insulates between the first external electrode 101 as a conductor case on the heat radiating side and the second external electrode 107 as a conductor case on the heat absorbing side. The insulation makes it possible to use part of the case as an electrode for charging. The electrostatic discharge pattern 115 is incorporated in the heat generator 104, and provided on a wiring board for extracting a power generation output voltage. The output of the heat generator 104 is supplied to second connecting means 113 and as a reference voltage 111 to the movement 201. Also, the reference voltage 111 is connected also to the second external electrode 107. Although the air discharge layer 116 is connected to the first external electrode 101 and second external electrode 107, the detail will be explained later.

Figure 5:
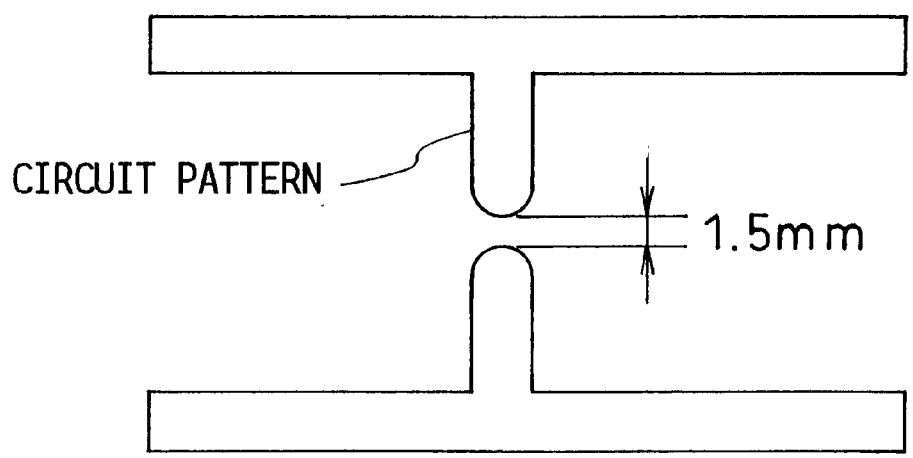

A concrete pattern of the electrostatic discharge pattern 115 provided on the heat generator 104 is shown in FIG. 5. A discharge interval between circuit patterns was determined 1.5 mm. These patterns are connected to metal electrodes provided on the upper and lower surfaces of the heat generator 104. From these upper and lower electrodes, connections are to the first external electrode 101 as a conductor case on a heat radiation side and to the second external electrode 107 as a conductor case on a heat absorbing side. In accordance with surrounding circuit conditions the discharge interval may take a value of 0.5 mm–2.5 mm.

Figure 6:
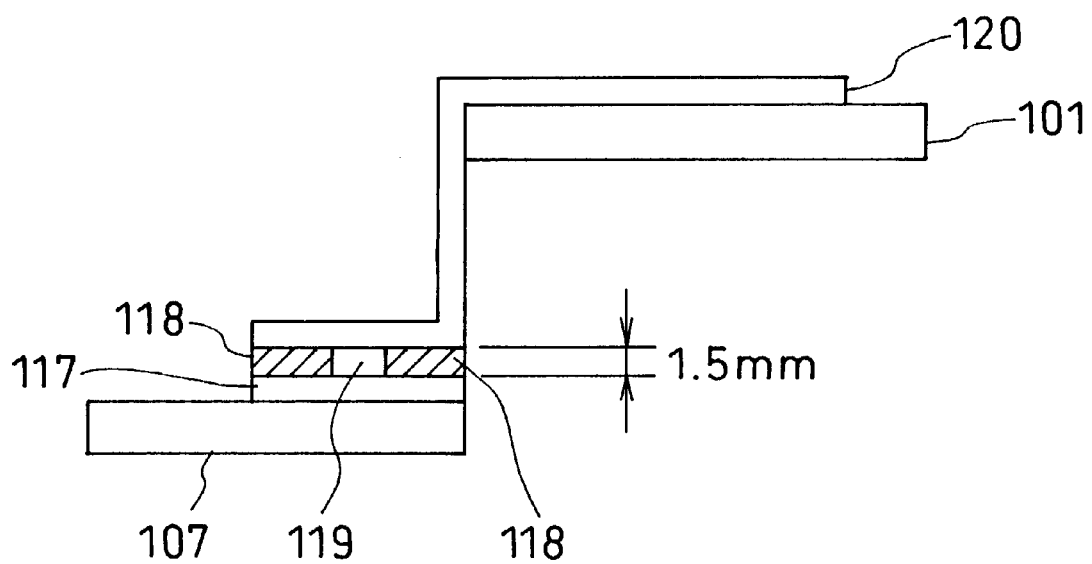

Next, the air discharge layer 116 of FIG. 4 is explained in detail. Its detailed sectional view is shown in FIG. 6. An insulation material 118 is a material having a surface resistivity of 10^5 or higher and uses plastic or the like. The insulation material 118 has at an underside a conductor layer 117 provided by evaporation or bonding. The conductor layer 117 is a general metal conductor. The conductor layer 117 is fixed to the second external electrode 107 by bonding or the like and electrically connected thereto. A metal plate 120 in a z-character form is pressed against a top surface of the insulation material 118. The other end surface is fixed to the first external electrode 101 by bonding or the like through electrical conduction. The insulation material 118 is opened with a hole, and this space is an air discharge layer 119. The air discharge layer 116 had a gap determined as 1.5 mm. The air discharge layer 116 takes a value of 0.5–2.5 mm depending upon constituent materials of the insulation material and conductor layer.

Because it is preferred that the metal plate 120 is in close contact with the insulation material 118, although not shown it can be considered to provide a structure that the metal plate 120 is pressed against the insulation material 118 by an elastic member extending from a movement 201. Also, it is possible to provide a structure in which the metal plate 120 is divided into two so that one metal plate is bonded to the insulation material 118 and the other metal plate is elastically contacted with and conducted to this metal plate. Furthermore, it can be considered that the conductor layer 117 or metal plate 120 at a portion facing the air discharge layer 119 is sharpened to stabilize discharge.

Due to the structure, the gap between the electrodes is kept stable by the thickness of the insulation material 118, stabilizing discharge voltage. Also, the conductor layer 117 and the metal plate 120 are comparatively thick metal with sufficiently low resistance impedance. Accordingly, there is no case in which the voltage is increased by a discharge current, stably keeping a trouble-reduction effect due to static electricity.

The content and result of a static: electricity discharge test is shown in Table 1. Here, the performance and characteristic of an ESA simulator are as follow:

energy storage capacity Cs: 150 PF discharge resistance Rd: 330 Ω charge resistance Rch: 50 MΩ.

TABLE 1

| | TEST | | DISCHARGE TEST RESULT | |
| --- | --- | --- | --- | --- |
| | VOLTAGE | | | INVENTIVE |
| SEVERENESS LEVEL | CONTACT DISCHARGE | IN-AIR DISCHARGE | CONVENTIONAL CIRCUIT | CIRCUIT PATTERN |
| 1 | 2 KV | 2 KV | ACCEPTABLE | ACCEPTABLE |
| 2 | 4 KV | 4 KV | ACCEPTABLE | ACCEPTABLE |
| 3 | 6 KV | 8 KV | ACCEPTABLE | ACCEPTABLE |
| 4 | 8 KV | 15 KV | NOT ACCEPTABLE | ACCEPTABLE |

Incidentally, the present embodiment is explained in the case of a thermoelectric generating timepiece. However, by changing electrode shape or arrangement it is possible to apply invention to a timepiece having a generator and capacitor such as a solar generator timepiece, a timepiece having a capacitor without having a generator, a portable electronic appliance and a home electric appliance.

Although in the explanations so far both the electrostatic discharge pattern 115 and the air discharge layer 116 were used, either one provides an effect. A structure using either one is included in the present invention.

Also, a structure is possible in which an electrostatic discharge pattern as shown in FIG. 5 is formed by metal evaporation or the like on an inner surface of a heat insulation case body 203, and this electrode is extended as required to the upper and lower surfaces of the heat insulation case body 203, to connect the first external electrode 101 with the second external electrode 107. This is included in the scope of the present invention.

Furthermore, as an static electricity protection circuit to be used after reducing electricity noise due to static electricity by the static electricity discharge pattern 115 and air discharge layer 116 a filter circuit using a capacitor and resistor is used to reduce spike noise. By limiting peaks of spike noise by a zener diode or the like, the affect of static electricity can be reduced from entering an electronic circuit.

According to the present invention, particularly in a timepiece of so-called a structure ready for static electricity to enter having a structure that an insulation member of a thermoelectric generating timepiece is used as an insulator and a case on a heat absorbing side and a case on a heat radiating side are used as externally charging electrode terminals, high voltage due to static electricity is bypassed and reduced using comparatively inexpensive additional electrodes and additional parts, preventing malfunction or breakage or deterioration.

What is claimed is:

1. In an electronic timepiece having a case having a conductive case portion and an insulative case portion, and electric power generator means for generating electric power for driving a timepiece movement in response to input energy: wherein the conductive case portion comprises a plurality of conductive members divided by the insulative case portion, each conductive member being electrically insulated from the one or more other conductive members by the insulative case portion; and wherein the electric power generator means includes a static electricity discharge circuit pattern formed thereon for discharging static electricity.

2. An electronic timepiece according to claim 1; wherein the conductive members are thermally conductive and the insulative member is thermally insulative.

3. An electronic timepiece according to claim 1; wherein the electric power generator means has a pair of electrodes and the static electricity discharge circuit pattern has opposing electrodes respectively connected to the electrodes of the electric power generator means.

4. An electronic timepiece according to claim 3; wherein the static electricity discharge pattern comprises first and second conductive patterns separated by a gap.

5. An electronic timepiece according to claim 3, wherein the gap is in the range of about 0.5 mm–2.5 mm.

6. An electronic timepiece according to claim 3; wherein the gap is 1.5 mm.

7. An electronic timepiece according to claim 1; wherein the electric power generator means comprises a thermoelectric generator.

8. An electronic timepiece according to claim 1; wherein the electric power generator means comprises a thermoelectric generator having opposing substrates for generating electric power in response to a temperature difference thereacross; and the static electricity discharge circuit pattern is formed on one of the substrates and has opposing electrodes respectively connected to the opposing substrates of the thermoelectric generator.

9. An electronic timepiece according to claim 8; wherein the static electricity discharge pattern comprises first and second conductive patterns separated by a gap.

10. An electronic timepiece according to claim 1; wherein the conductive members forming the conductive case portion comprise a rear cover portion of the case and a front cover portion of the case, and the insulative case portion comprises an insulative portion of the case disposed between the front and rear covers.

11. An electronic timepiece according to claim 10; wherein the electric power generator means comprises a thermoelectric generator having opposing substrates for generating electric power in response to a temperature difference across the opposing substrates, the opposing substrates comprising a heat absorbing substrate and a heat radiating substrate, and wherein the heat absorbing substrate is in contact with the rear cover portion of the case and the heat radiating side is in contact with the front cover portion of the case.

12. An electronic timepiece according to claim 11; wherein the static electricity discharge circuit pattern has opposing electrodes respectively connected to the opposing substrates of the thermoelectric generator.

13. An electronic timepiece according to claim 10; wherein the front and rear cover portions of the case serve as electrodes for connection to an external charging device.

14. An electronic timepiece according to claim 1; wherein the conductive members forming the conductive case portion comprise a rear cover portion of the case and a front cover portion of the case, and the insulative case portion comprises an insulative portion of the case disposed between the front and rear covers; and further comprising a static electricity discharge layer formed between the front cover portion and the rear cover portion of the case for discharging into air static electricity applied to the case to prevent an internal circuit of the timepiece from exposure to the static electricity.

15. An electronic timepiece according to claim 1; further comprising a static electricity protection circuit connected to the conductive case portion.

16. In an electronic timepiece having a case having a conductive case portion and an insulative case portion, and electric power generator means for generating electric power for driving a timepiece movement in response to input energy: wherein the conductive case portion comprises a plurality of conductive members divided by the insulative case portion, each conductive member being electrically insulated from the other conductive members by the insulative case portion; and further comprising a static electricity discharge layer formed between the conductive members of the case for discharging static electricity into air, the static electricity discharge layer comprising a plurality of conductive metal layers electrically connected to the plurality of conductive members of the case, and an insulation material disposed between the conductive metal layers.

17. An electronic timepiece according to claim 6; wherein the electric power generator means comprises a thermoelectric generator having opposing substrates for generating electric power in response to a temperature difference thereacross.

18. An electronic timepiece according to claim 17; further comprising a static electricity discharge circuit pattern formed on one of the substrates of the thermoelectric generator and having opposing electrodes respectively connected to the opposing substrates of the thermoelectric generator.

19. An electronic timepiece according to claim 16; wherein the static electricity discharge layer has an air gap formed in the insulation material.

20. An electronic timepiece according to claim 2; wherein the conductive members forming the conductive case portion comprise a rear cover portion of the case and a front cover portion of the case, and the insulative case portion comprises an insulative portion of the case disposed between the front and rear covers.

21. An electronic timepiece according to claim 2; wherein the conductive members are thermally conductive and the insulative member is thermally insulative.

22. An electronic timepiece comprising:
a movement for counting time;
a display for displaying time;
a power source for driving the movement;
a case for housing the movement, the power source and the display;
and a static electricity discharge path disposed in the case for discharging static electricity applied to the case into air to alleviate static charge from being input to the movement, the static electricity discharge path comprising a static electricity discharge pattern formed in the power source.

23. An electronic timepiece according to claim 22; wherein the static electricity discharge pattern comprises first and second conductive patterns separated by a gap.

24. An electronic timepiece according to claim 22; wherein the power source has a pair of electrodes and the static electricity discharge path comprises a circuit pattern having opposing electrodes respectively connected to the electrodes of the power source.

25. An electronic timepiece according to claim 24; wherein the circuit comprises first and second conductive patterns separated by a gap.

26. An electronic timepiece according to claim 25; wherein the gap is in the range of about 0.5 mm–2.5 mm.

27. An electronic timepiece according to claim 25; wherein the gap is 1.5 mm.

28. An electronic timepiece according to claim 22; wherein the power source comprises a thermoelectric generator.

29. An electronic timepiece according to claim 28; wherein the thermoelectric generator has opposing substrates for generating electric power in response to a temperature difference thereacross, and the static electricity discharge path comprises a circuit pattern formed on one of the substrates and having opposing electrodes respectively connected to the opposing substrates of the thermoelectric generator.

30. An electronic timepiece according to claim 22; wherein the case comprises a plurality of conductive members and an insulating member separating the conductive members, the conductive members comprising a rear cover and a front cover of the case, and the insulating member disposed between the front and rear covers.

31. An electronic timepiece according to claim 30; wherein the static electricity discharge path is formed between the front cover and the rear cover of the case for discharging into air static electricity applied to the case to prevent the movement from exposure to the static electricity.

32. An electronic timepiece comprising:
a movement for counting time;
a display for displaying time;
a power source having a rechargeable battery for driving the movement;
a case for housing the movement, the power source and the display;
external connection terminals provided on the case for connecting the battery to an external charger to charge the battery; and
a static electricity discharge path disposed in the case for discharging static electricity applied to the external connection terminals into air to alleviate static charge from being input to the movement.

33. An electronic timepiece according to claim 34; wherein the static electricity discharge path comprises a static electricity discharge pattern formed in the power source.

34. An electronic timepiece according to claim 32; wherein the case has a conductive case portion and an insulative case portion, the conductive case portion comprising a plurality of conductive members divided by the insulative case portion, each conductive member being electrically insulated from the other conductive members by the insulative case portion; and wherein the conductive members serve as the external connection terminals.

35. An electronic timepiece according to claim 34; wherein the static electricity discharge path comprises a static electricity discharge layer formed between the conductive members of the case for discharging static electricity into air.

36. An electronic timepiece according to claim 35; wherein the static electricity discharge layer comprises a plurality of metal conductor layers electrically connected to the plurality of conductive members of the case, and an insulation material disposed between the metal conductor layers, the insulation material having an air gap formed therein.

37. An electronic timepiece according to claim 32; wherein the static electricity discharge pattern comprises first and second conductive patterns separated by a gap.

38. An electronic timepiece according to claim 32; wherein the power source further comprises a thermoelectric generator having opposing substrates for generating electric power in response to a temperature difference thereacross, and the static electricity discharge path comprises a circuit pattern formed on one of the substrates and having opposing electrodes respectively connected to the opposing substrates of the thermoelectric generator.

39. An electronic timepiece according to claim 38; wherein the case comprises a plurality of conductive members and an insulating member separating the conductive members, the conductive members comprising a rear cover and a front cover of the case, and the insulating member disposed between the front and rear covers.

40. An electronic timepiece according to claim 39; wherein the static electricity discharge path is formed between the front cover and the rear cover of the case for discharging into air static electricity applied to the case to prevent the movement from exposure to the static electricity.

* * * * *